United States Patent
Zhang et al.

(10) Patent No.: US 10,121,822 B2
(45) Date of Patent: Nov. 6, 2018

(54) LIGHT-EMITTING DEVICE AND METHOD OF FORMING THE SAME

(71) Applicant: Nanyang Technological University, Singapore (SG)

(72) Inventors: Xueliang Zhang, Singapore (SG); Zi-Hui Zhang, Singapore (SG); Yun Ji, Singapore (SG); Zhen Gang Ju, Singapore (SG); Wei Liu, Singapore (SG); Swee Tiam Tan, Singapore (SG); Xiaowei Sun, Singapore (SG); Hilmi Volkan Demir, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 37 days.

(21) Appl. No.: 15/100,748

(22) PCT Filed: Nov. 18, 2014

(86) PCT No.: PCT/SG2014/000541
§ 371 (c)(1),
(2) Date: Jun. 1, 2016

(87) PCT Pub. No.: WO2015/084258
PCT Pub. Date: Jun. 11, 2015

(65) Prior Publication Data
US 2016/0307959 A1    Oct. 20, 2016

Related U.S. Application Data

(60) Provisional application No. 61/910,609, filed on Dec. 2, 2013.

(51) Int. Cl.
*H01L 33/48*    (2010.01)
*H01L 27/15*    (2006.01)
(Continued)

(52) U.S. Cl.
CPC ............ *H01L 27/156* (2013.01); *H01L 33/22* (2013.01); *H01L 33/32* (2013.01); *H01L 33/38* (2013.01);
(Continued)

(58) Field of Classification Search
None
See application file for complete search history.

(56) References Cited

U.S. PATENT DOCUMENTS 6,459,100 B1    10/2002    Doverspike et al.
6,933,160 B2    8/2005    Hon
(Continued)

FOREIGN PATENT DOCUMENTS

KR    10-2013-0065327 A    6/2013

OTHER PUBLICATIONS

Kim, "Vertical Structure GaN-Based Light Emitting Diodes with Electrochemically Deposited Stress-Free Nickel Substrate," *Journal of the Electrochemical Society* 159(4):D196-D199, 2012.
(Continued)

*Primary Examiner* — Ali Naraghi
(74) *Attorney, Agent, or Firm* — Seed IP Law Group LLP

(57) ABSTRACT

A light-emitting device may include an active layer. The light-emitting device may include a first semiconductor layer of a first conductivity type. The first semiconductor layer may be in physical contact with the active layer. The light-emitting device may also include a second semiconductor layer of a second conductivity type. The second semiconductor layer may be in physical contact with the active layer and opposite the first conductive layer. The light-emitting device may further include a first electrode in physical contact with a first side of the first semiconductor layer. The light-emitting device may additionally include a second electrode in physical contact with a second side of
(Continued)

the first semiconductor layer. The second side of the first semiconductor layer may be different from the first side of the first semiconductor layer. The light-emitting device may also include a third electrode in physical contact with the second semiconductor layer.

19 Claims, 13 Drawing Sheets

(51) Int. Cl.
    *H01L 33/38*     (2010.01)
    *H01L 33/22*     (2010.01)
    *H01L 33/32*     (2010.01)
    *H01L 33/44*     (2010.01)

(52) U.S. Cl.
    CPC ............ *H01L 33/382* (2013.01); *H01L 33/44* (2013.01); *H01L 2933/0016* (2013.01)

(56) References Cited

U.S. PATENT DOCUMENTS

| | | | |
|---|---|---|---|
| 7,250,638 B2 | 7/2007 | Lee et al. | |
| 7,897,420 B2 | 3/2011 | Chu et al. | |
| 7,928,465 B2 | 4/2011 | Lee et al. | |
| 8,143,640 B2 | 3/2012 | Lee | |
| 2005/0176255 A1* | 8/2005 | Casey | H01L 21/4846 438/694 |
| 2012/0181546 A1 | 7/2012 | Tu | |
| 2012/0241783 A1* | 9/2012 | Jou | H01L 27/156 257/93 |
| 2013/0009196 A1* | 1/2013 | Iwanaga | H01L 33/382 257/99 |
| 2014/0124731 A1* | 5/2014 | Jeong | H01L 33/002 257/13 |
| 2014/0145224 A1* | 5/2014 | Hsu | H01L 33/0062 257/98 |

OTHER PUBLICATIONS

Luo et al., "Vertical InGaN Multiple Quantum Wells Light-Emitting Diodes Structures Transferred from Si(111) Substrate onto Electroplating Copper Submount with Through-Holes," *Japanese Journal of Applied Physics* 51:012101-1-012101-4, 2012.

* cited by examiner

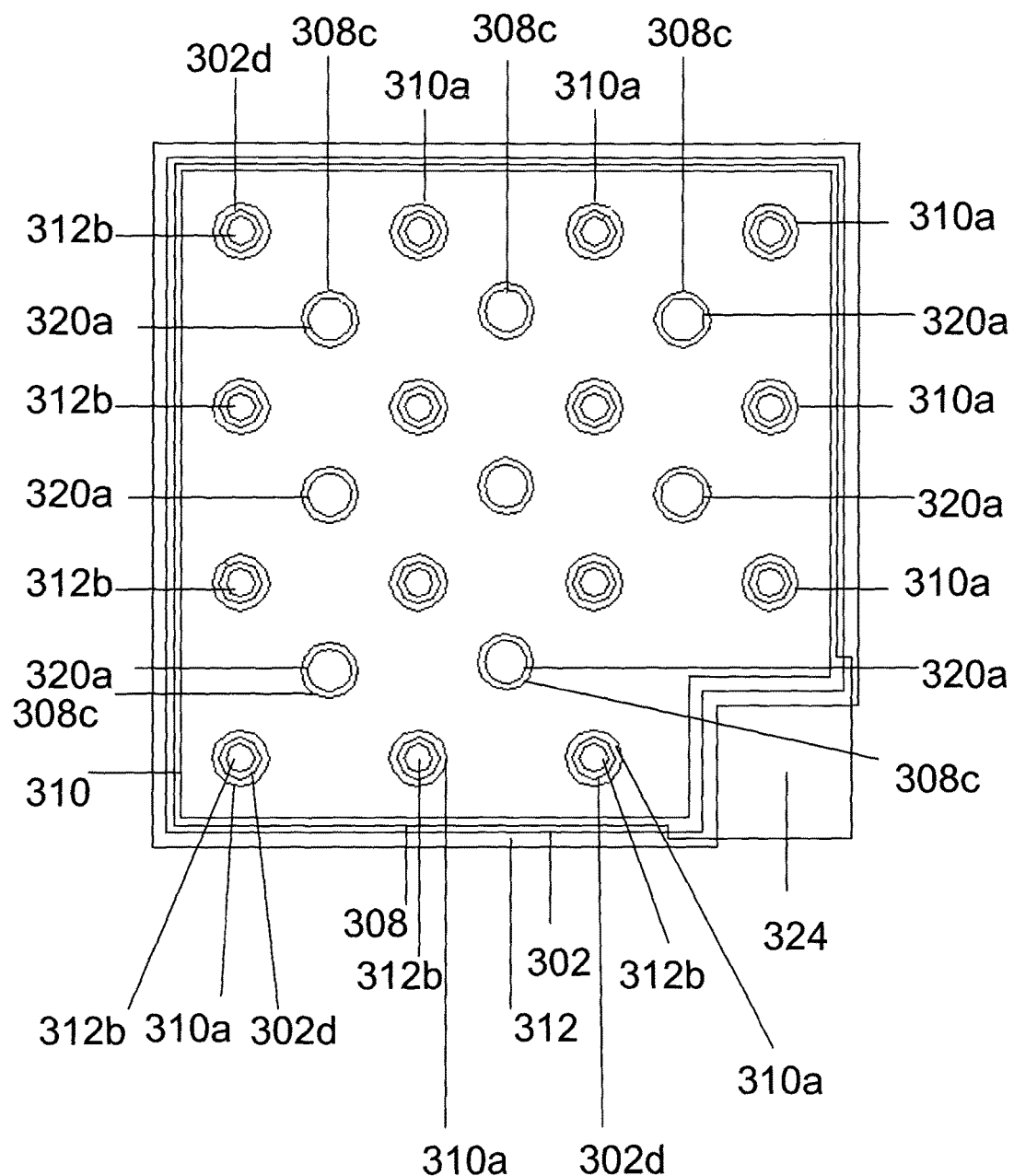

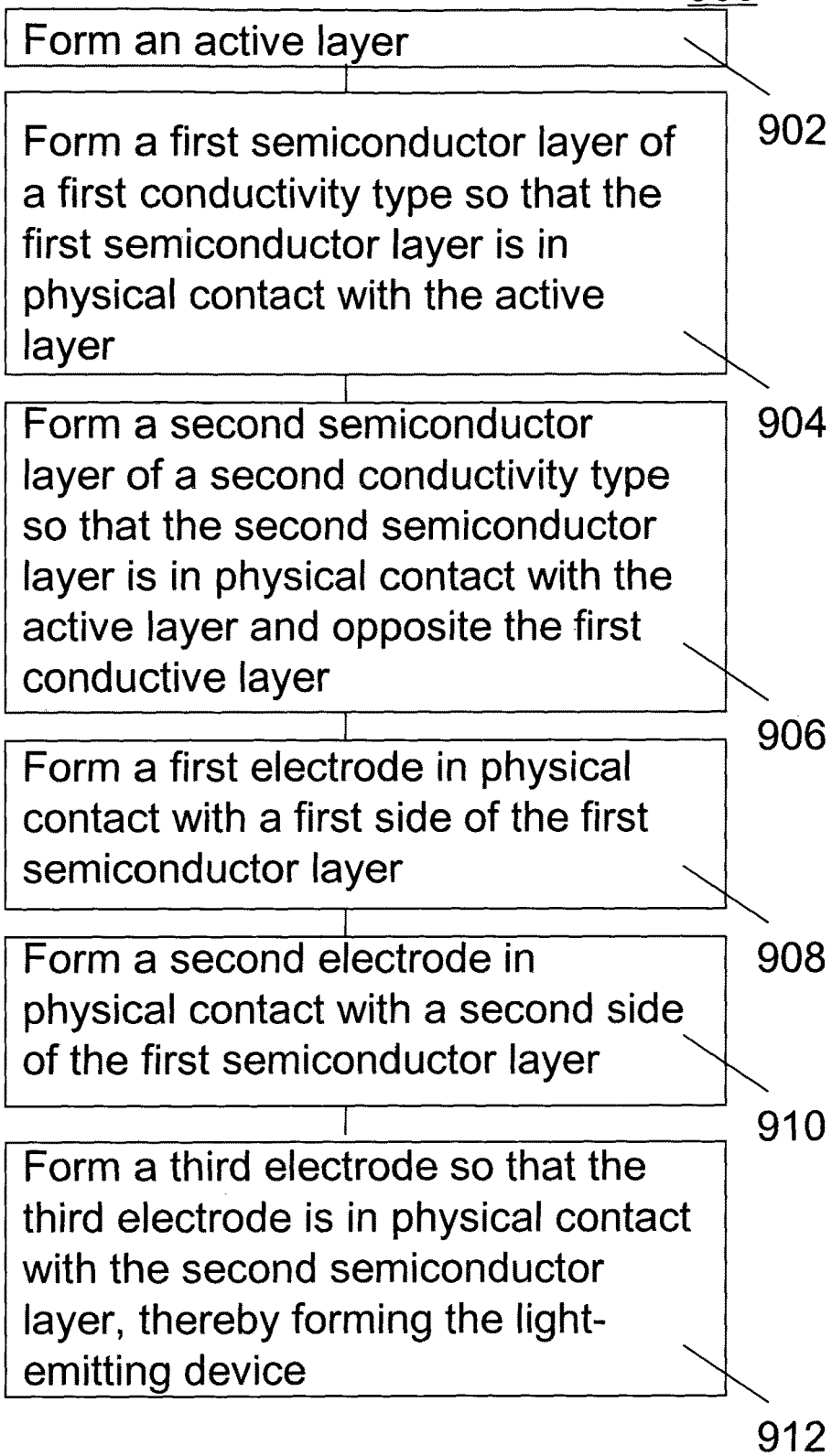

LIGHT-EMITTING DEVICE AND METHOD OF FORMING THE SAME

CROSS-REFERENCE TO RELATED APPLICATION

This application claims the benefit of priority of U.S. patent application No. 61/910,609, filed 2 Dec. 2013, the content of it being hereby incorporated by reference in its entirety for all purposes.

TECHNICAL FIELD

Various aspects of this disclosure relate to light-emitting devices and methods of forming the same.

BACKGROUND

Light-emitting diodes are important solid state devices that convert electrical power to light output. For light-emitting diodes based on Gallium nitride (GaN), the light may be generated from an active region which is "sandwiched" between a p-doped layer and an n-doped layer. Light-emitting diodes could be classified into diodes having a conventional horizontal structured device architecture and diodes having a vertical structured device architecture. In the conventional horizontal structured diodes, parts of the device may be covered by both p-electrode and n-electrode, which may reduce the lighting emitting area and light extraction efficiency, and which may also lead to current crowding problem, especially at high operating current regime. On the contrary, the vertical structured diode has several advantages in comparison with the horizontal structured diode. Typically, for the vertical structured diodes, the p-electrode and the n-electrode are fabricated separately on the top and the bottom of the device. Such electrode arrangement may increase the emitting area and may also reduce the current crowding effect. Moreover, the vertical structured diode could be bonded or attached to a conductive carrier (e.g. metal or silicon), which is beneficial to the thermal management and current spreading.

FIG. 1 is a schematic 100 illustrating a typical vertical structured light-emitting diode where an "epitaxial layer stack" 102 includes an p-doped GaN layer 102a, and a n-doped GaN layer 102c separated by the multiple-quantum wells (MQWs) layer 102b. The device is typically grown on a selected carrier (removed during process, not shown in FIG. 1) such as sapphire ($Al_2O_3$), silicon (Si), silicon carbide (SiC), and gallium nitride (GaN). A reflective layer 104 is deposited on the surface of the p-doped layer 102a. The reflective layer 104 serves as both the ohmic contact layer and the light reflection layer. The sidewall of the device is protected by a passivation layer 110, such as silicon oxide or photoresist. A conductive carrier 108 is plated by electroplating method on a seed layer 106. An n-electrode 112 is deposited as the contact electrode of the n-doped layer 102c. The position for the n-electrode 112 may be on the top surface or in the middle of the n-doped layer 102c. The surface of the n-doped layer 102c is treated by wet chemical etching method or dry etching method for surface texturing.

In the typical structure design of vertical structured GaN-based light-emitting diodes, the n-electrode 112 is patterned by the method of photolithography on the top surface of the n-doped layer 102c. The n-electrode 112 consists of metal stacks and is light-blocking, which leads to loss of light emitting from the MQWs layer 102b. Moreover, the current spreading is restricted by the conductivity of the n-electrode 112 layout, which may lead to efficiency drop, especially in the high current density regime.

SUMMARY

In various embodiments, a light-emitting device may be provided. The light-emitting device may include an active layer. The light-emitting device may include a first semiconductor layer of a first conductivity type. The first semiconductor layer may be in physical contact with the active layer. The light-emitting device may also include a second semiconductor layer of a second conductivity type. The second semiconductor layer may be in physical contact with the active layer and opposite the first conductive layer. The light-emitting device may further include a first electrode in physical contact with a first side of the first semiconductor layer. The light-emitting device may additionally include a second electrode in physical contact with a second side of the first semiconductor layer. The second side of the first semiconductor layer may be different from the first side of the first semiconductor layer. The light-emitting device may also include a third electrode in physical contact with the second semiconductor layer.

In various embodiments, a method of forming a light-emitting device may be provided. The method may include forming an active layer. The method may include forming a first semiconductor layer of a first conductivity type so that the first semiconductor layer is in physical contact with the active layer. The method may also include forming a second semiconductor layer of a second conductivity type so that the second semiconductor layer is in physical contact with the active layer and opposite the first conductive layer. The method may further include forming a first electrode in physical contact with a first side of the first semiconductor layer. The method may additionally include forming a second electrode in physical contact with a second side of the first semiconductor layer, the second side of the first semiconductor layer different from the first side of the first semiconductor layer. The method may also include forming a third electrode so that the third electrode is in physical contact with the second semiconductor layer, thereby forming the light-emitting device.

BRIEF DESCRIPTION OF THE DRAWINGS

The invention will be better understood with reference to the detailed description when considered in conjunction with the non-limiting examples and the accompanying drawings, in which:

FIG. 3C is a schematic showing a cross-sectional planar view of the light-emitting device according to various embodiments.

FIG. 9 is a schematic illustrating a method of forming a light-emitting device according to various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, structure, or array or any part of any device, structure, or array.

A first layer over a second layer may include the first layer on the second layer or the first layer separated from the second layer by one or more intervening layers.

Figure 1:
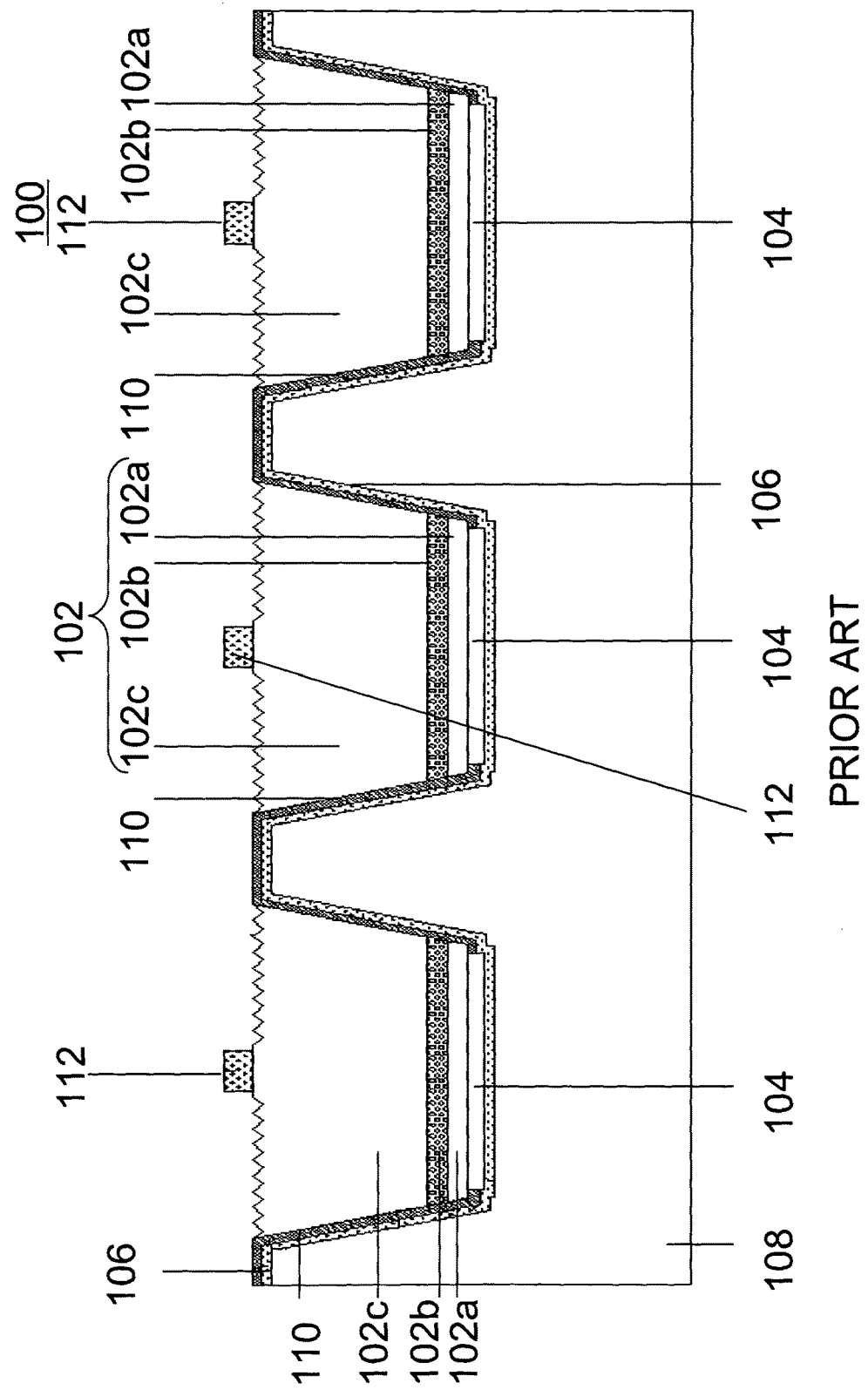
FIG. 1 is a schematic illustrating a typical vertical structured light-emitting diode where an "epitaxial layer stack" includes an p-doped GaN layer, and a n-doped GaN layer separated by the multiple-quantum wells (MQWs) layer.
Figure 2A:
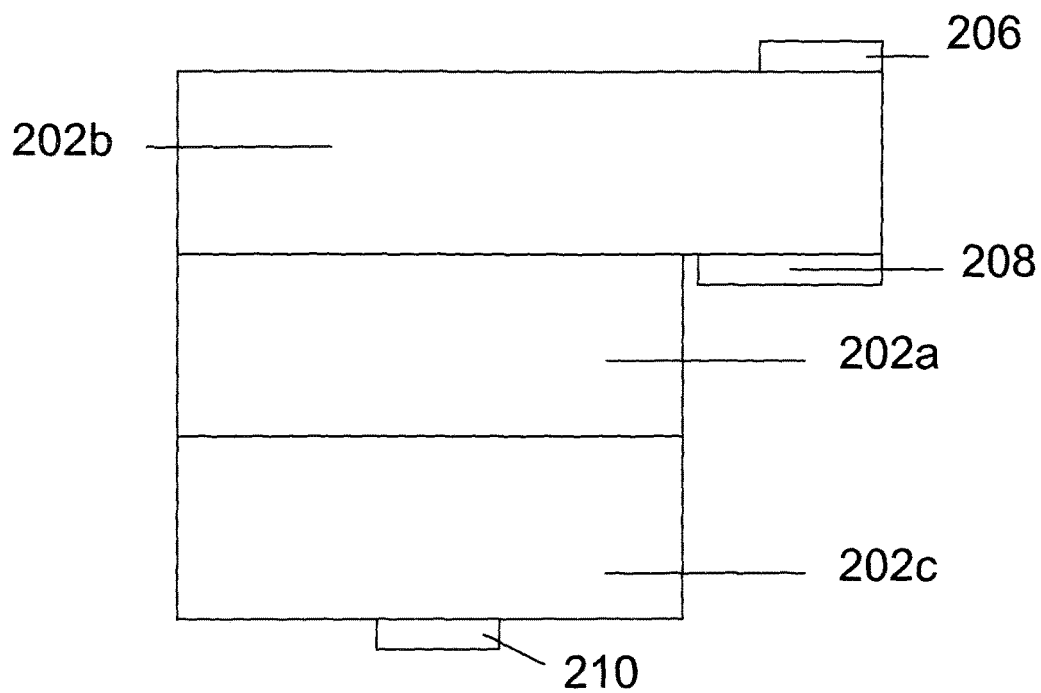
FIG. 2A is a schematic showing a cross-sectional side view of a light emitting device according to various embodiments.
Figure 2B:
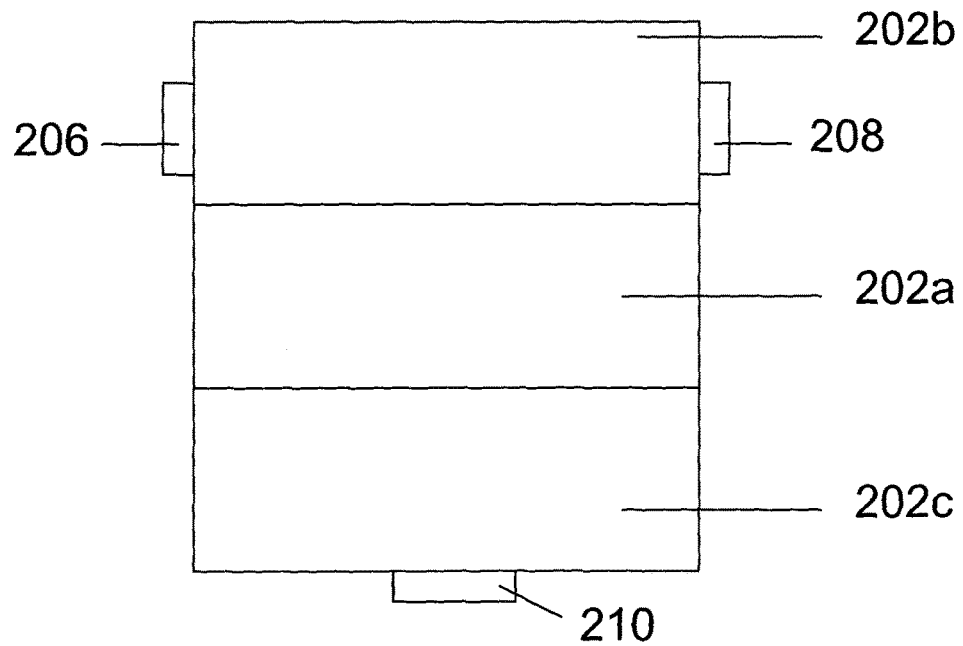
FIG. 2B is another schematic showing a cross-sectional side view of a light emitting device according to various embodiments.

FIG. 2A is a schematic 200a showing a cross-sectional side view of a light emitting device according to various embodiments. FIG. 2B is another schematic 200b showing a cross-sectional side view of a light emitting device according to various embodiments. The light-emitting device may include an active layer 202a. The light-emitting device may include a first semiconductor layer 202b of a first conductivity type. The first semiconductor layer 202b may be in physical contact with the active layer 202a. The light-emitting device may also include a second semiconductor layer 202c of a second conductivity type. The second semiconductor layer 202c may be in physical contact with the active layer 202a and opposite the first conductive layer 202b. The light-emitting device may further include a first electrode 206 in physical contact with a first side of the first semiconductor layer 202b. The light-emitting device may additionally include a second electrode 208 in physical contact with a second side of the first semiconductor layer 202b. The second side of the first semiconductor layer 202b may be different from the first side of the first semiconductor layer 202b. The light-emitting device may also include a third electrode 210 in physical contact with the second semiconductor layer 202c.

In other words, the light-emitting device may include an active layer 202a between a first semiconductor layer 202b and a second semiconductor layer 202c. A first electrode 206 may be in physical contact with one side of the first semiconductor layer 202b and a second electrode 208 may be in physical contact with another separate side of the first semiconductor layer 202b. A third electrode 210 may be in physical contact with the second semiconductor layer 202c. The first semiconductor layer 202b may be doped differently from the second semiconductor layer 202c.

Various embodiments may help to address or alleviate one or more problems as highlighted above.

Various embodiments may provide a double-sided guiding design. Various embodiments may improve the uniformity of current spreading and thus contribute to the reduction of the forward voltage and/or efficiency drop in the light-emitting device, especially in the high current density regime. The light-emitting device may be a vertical structured diode.

In various embodiments, the double-sided guiding design may be provided by the first electrode and the second electrode. One current guiding structure may be or may include the first electrode while another current guiding structure may be or may include the second electrode.

The active layer may be or may include a multi-quantum well (MQW) layer. In various embodiments, the active layer may be or may include an indium gallium nitride (InGaN)/gallium nitride (GaN) layer. In various embodiments, the active layer may be a quantum well layer. The active layer may include a InGaN layer or a GaN layer.

In various embodiments, the second side of the first semiconductor layer may be opposite the first side of the first semiconductor layer. In other words, the first electrode 206 and the second electrode 208 may be formed on opposing sides of the first semiconductor layer 202b.

In various other embodiments, the first semiconductor layer 202b may further include a third side opposite the first side of the first semiconductor layer 202b. The second side of the first semiconductor layer 202b may join the first side of the first semiconductor layer 202b to the third side of the first semiconductor layer 202b.

In various embodiments, the first side of the first semiconductor layer 202b may be a surface side of the first semiconductor layer 202b while the second side of the first semiconductor layer 202b may be a lateral side adjoining the surface side of the first semiconductor layer 202b. In various embodiments, the first side of the first semiconductor layer 202b may be a surface side of the first semiconductor layer 202b while the second side of the first semiconductor layer 202b may be a side opposing to the surface side of the first semiconductor layer 202b. Light generated from the light-emitting device may be transmitted through the surface side to the external environment. The surface side of the first semiconductor layer 202b may be the side facing away from the active layer 202a.

The surface side may be an exposed surface. In various embodiments, the first electrode 206 may be on the exposed surface of the first semiconductor layer 202b and the second electrode 208 may be at least partially buried under the first semiconductor layer 202b. In various embodiments, the second electrode 208 may not be buried under the first semiconductor layer 202b.

In various embodiments, the first semiconductor layer 202b may be a n-doped layer. The first electrode 206 may be referred to as a n-electrode layer. The second electrode 208 may be referred to as a n-contact layer. The second semiconductor layer 202c may be a p-doped layer. The third electrode 210 may be referred to as a p-electrode. A p-doped layer may alternatively be referred to as a hole-injection layer. A n-doped layer may alternatively be referred to as an electron-injection layer. For instance, the first semiconductor layer 202b may be or may include a n-GaN layer such as a silicon doped GaN layer. The second semiconductor layer 202c may be or may include a p-GaN layer such as a magnesium doped GaN layer.

The first electrode 206 may be in physical contact with the second electrode 208. The first electrode 206 and the second electrode 208 may be continuous. The first electrode 206 and the second electrode 208 may form a single electrode.

The first electrode 206, the second electrode 208 and/or the third electrode 210 may be patterned to further improve current spreading. For instance, the second electrode 208 may be patterned to form a plurality of via portions.

In various embodiments, the light-emitting device may include a passivation layer separating the second electrode 208 from the active layer 202a, the second semiconductor layer 202c and the third electrode 210. In other words, the passivation layer may be between the second electrode 208 and the active layer 202a. The passivation layer may also be between the second electrode 208 and the active layer 202a. Further, the passivation layer may be between the second electrode 208 and the third electrode 210. The passivation structure may extend laterally from the first semiconductor layer 202b to the third electrode 210. In various embodiments, the passivation layer may include an insulating inorganic material selected from a group consisting of silicon oxide, silicon nitride, titanium dioxide, aluminum oxide, magnesium oxide, hafnium oxide and tantalum oxide. In various alternate embodiments, the passivation layer may include a suitable organic material such as a polymer or a photoresist, e.g. NR-7 or SU-8.

The passivation layer may include one or more passivation structures. The light emitting device may include one or more via holes extending from the active layer to the third electrode. Each passivation structure may be within each of the one or more via holes extending from the active layer to the third electrode. In other words, one via hole extending from the active layer to the third electrode layer may contain one passivation structure. In general, a first structure "within" a second structure may mean that the first structure and the second structure forms a concentric arrangement with the first structure surrounded by the second structure. Similarly, a first structure within a hole or cavity of a second structure may mean that the first structure and the second structure forms a concentric arrangement with the first structure surrounded by the second structure. The first structure may be a cylindrical or a tubular structure and the second structure may be a tubular structure. The (outer) circumferential surface of the cylindrical or tubular first structure may face the inner circumferential surface of the tubular second structure.

Each passivation structure may include a via portion of the second electrode 208. The via portion of the second electrode may be within each passivation structure. One via portion of the second electrode may be within a passivation structure. Each passivation structure may include a via hole for carrying one via portion of the second electrode 208. One via portion of the second electrode 208 may be within one via hole of the passivation layer.

The passivation structure may physically contact the first semiconductor layer 202b. The passivation structure may carry the via portion of the second electrode 208 to contact the first semiconductor layer 202b while separating the via portion of the second electrode 208 from the active layer 202a, the second semiconductor layer 202c and the third electrode 210. In other words, the passivation layers may include one or more via holes, each via hole carrying one via portion of the second electrode 208 to contact the first semiconductor layer 202b.

The passivation layer may be configured to protect the active layer 202a during forming of the first electrode 206. During patterning of the first electrode 206, the second semiconductor layer 202c may serve as an etch-stop. The passivation layer may cover the active layer 202a for protecting the active layer 202a during the etching process.

The passivation layer may include one or more further via holes. Each of the one or more further via holes of the passivation layer may include a via interconnect in (electrical) contact with the third electrode. The via interconnect may in electrical contact with the third electrode directly or via an electrically conductive barrier layer. One via interconnect may be within each of the one or more further via holes of the passivation structures. The light-emitting device may also include a connection layer in (electrical) contact with the via interconnect. The light-emitting device may further include a metal plating in (electrical) contact with the connection layer.

The light-emitting device may further include an isolation layer for separating the second electrode from the via interconnect. The isolation layer may be between the second electrode and the via interconnect. The isolation layer may be configured to separate the second electrode from the third electrode. The isolation layer may be between the second electrode and the third electrode. The isolation layer may additionally or alternatively separate the second electrode from the connection layer. The light-emitting device may further include a metal plating in (electrical) contact with the connection metal layer.

A portion of the first semiconductor layer 202b directly over the active region 202a may be configured to transmit light. The portion of the first semiconductor layer 202b directly over the active region 202a may be exposed to the environment or may be covered by a transparent layer. The surface side of the portion of the semiconductor layer 202 may be exposed to the environment or may be covered by a transparent layer. The portion of the first semiconductor layer directly over the active region may be unblocked by the first electrode. Light emitted from the active layer 202a may be transmitted unobstructed through the portion of the first semiconductor layer 202b. This may further improve efficiency. A portion of the first semiconductor layer 202b directly over the active region 202a may mean the portion of the first semiconductor layer 202b that is in the path of light generated by active layer 202a.

As shown in FIG. 2A, in various embodiments, a width of the first semiconductor layer 202b may be greater than a width of the active layer 202a. The first electrode 206 may be formed on a portion of the first semiconductor layer 202 not directly over the active layer 202, i.e. on the surface side of the portion of the first semiconductor layer 202. The portion of the first semiconductor layer 202 not directly over the active layer 202 may not in the path of light generated by the active layer 202a. In various other embodiments, the first electrode 206 may also be formed on or in contact with a lateral side of the first semiconductor layer 202 adjoining the surface side as shown in FIG. 2B.

As shown in FIG. 2B, in various embodiments, a width of the first semiconductor layer 202b may be substantially the same as a width of the active layer 202a. The width of the first semiconductor layer 202b may also be greater than or may be substantially the same as a width of the second semiconductor layer 202c.

The width of the first semiconductor layer 202b may extend from a lateral side of the first semiconductor layer 202b to a further lateral side of the first semiconductor layer 202b. Accordingly, the width of the active layer 202a may extend from a lateral side of the active layer 202a to a further lateral side of the active layer 202a. The width of the second semiconductor layer 202c may extend from a lateral side of the second semiconductor layer 202c to a further lateral side of the second semiconductor layer 202c.

The portion of the first semiconductor layer 202b directly over the active region may be patterned. In other words, the surface side of the first semiconductor layer 202b may be surface textured. Light generated travelling from a region of high refractive index (first semiconductor layer 202b) to a region of low refractive index (external environment) may undergo total internal reflection if light impinges on the boundary between the region of high refractive index and the region of low refractive index at an angle greater than the critical angle. Surface texturing may create light scattering centers for reducing total internal reflection.

The light-emitting device may further include a protection layer in contact with the portion of the first semiconductor layer 202b directly over the active layer 202a. The protection layer may protect the light-emitting device from the external environment. The protection layer may further protect the active layer 202a during etching of the first electrode 206.

The third electrode 210 may include a transparent conducting layer in contact with the second semiconductor layer 202c. The transparent conducting layer may form an ohmic contact with the second semiconductor layer 202c. The third electrode 210 may further include a reflective layer in contact with the transparent conducting layer. The transparent conductive layer may include transparent conductive oxides such as indium-tin-oxide (ITO) or a semi-transparent metal thin film such as palladium (Pd), titanium (Ti), nickel (Ni), chromium (Cr), aluminum (Al) or silver (Ag). The reflective layer may include aluminum (Al), silver (Ag), Al-based alloys or Ag-based alloys. The third electrode 210 may also include a conductive supporting layer in contact with the reflective layer. The conductive supporting layer may include platinum (Pt), nickel (Ni), palladium (Pd), silver (Ag), titanium (Ti), aluminum (Al), gold (Au), tungsten (W), chromium (Cr), copper (Cu), indium (In), tin (Sn), titanium nitride (TiN), tungsten titanium nitride (WTiN) or tantalum nitride (TaN).

The light-emitting device may be or may include a light-emitting diode such as an inorganic light-emitting diode, an organic light-emitting diode, a photovoltaic diode, a schhottky diode or any other rectifying diodes.

In various embodiments, a light-emitting array may be provided. The array may include a plurality of light-emitting devices as described herein. The array may also include one or more interconnecting layers. Each of the one or more interconnecting layers may be in contact with a first light-emitting device and a second light-emitting device of the plurality of light-emitting devices. An interconnecting layer may join two neighbouring light-emitting devices.

Various embodiments may provide new structure designs and array designs with double-sided current guiding electrodes for vertical structured diodes, which may improve the uniformity of current spreading and contribute to the reduction of efficiency drop in the devices.

Methods to achieve or form the various structures are also provided herein.

Figure 3A:
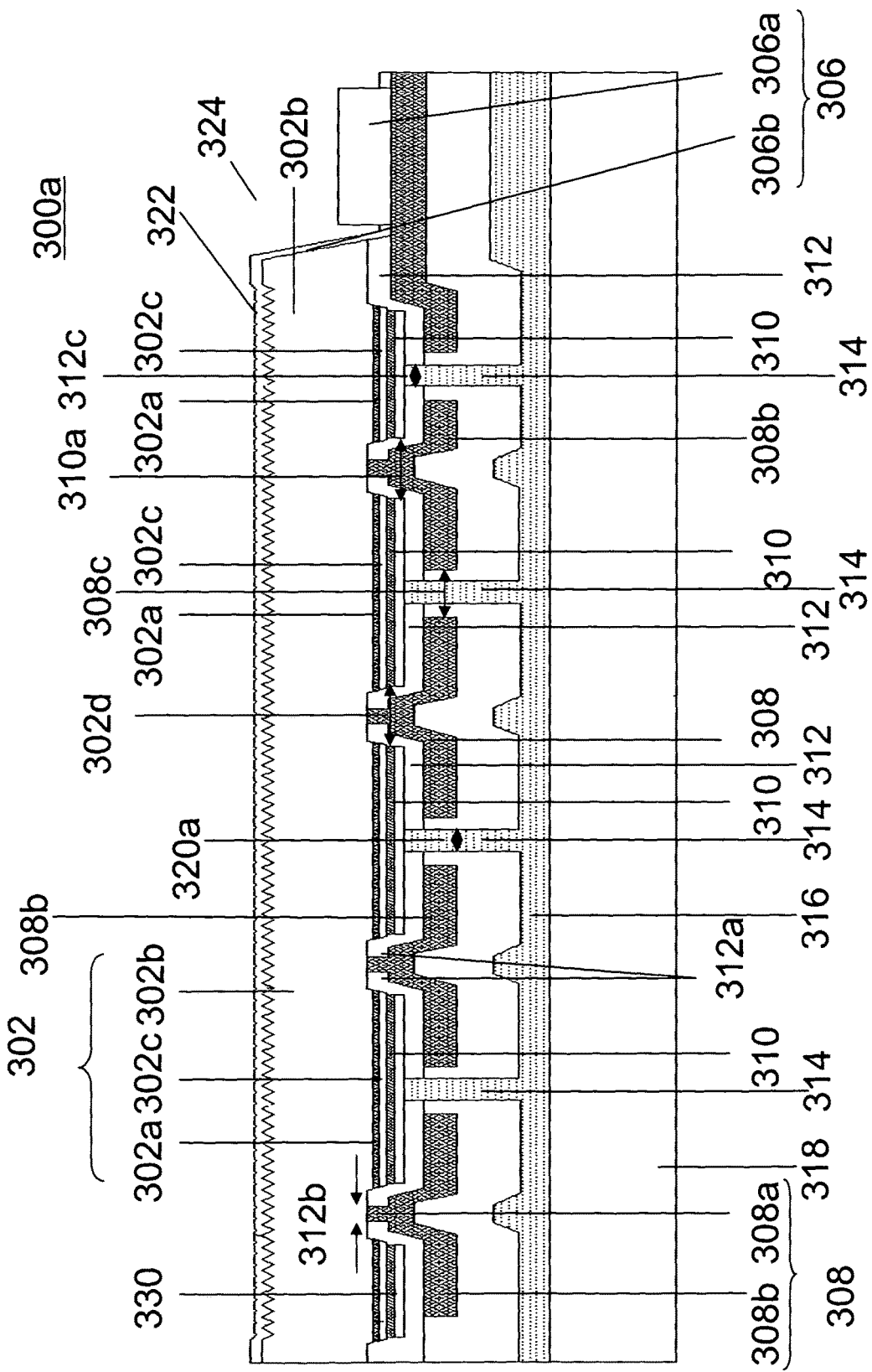
FIG. 3A is a schematic showing a cross-sectional side view of a light emitting device according to various embodiments.
Figure 3B:
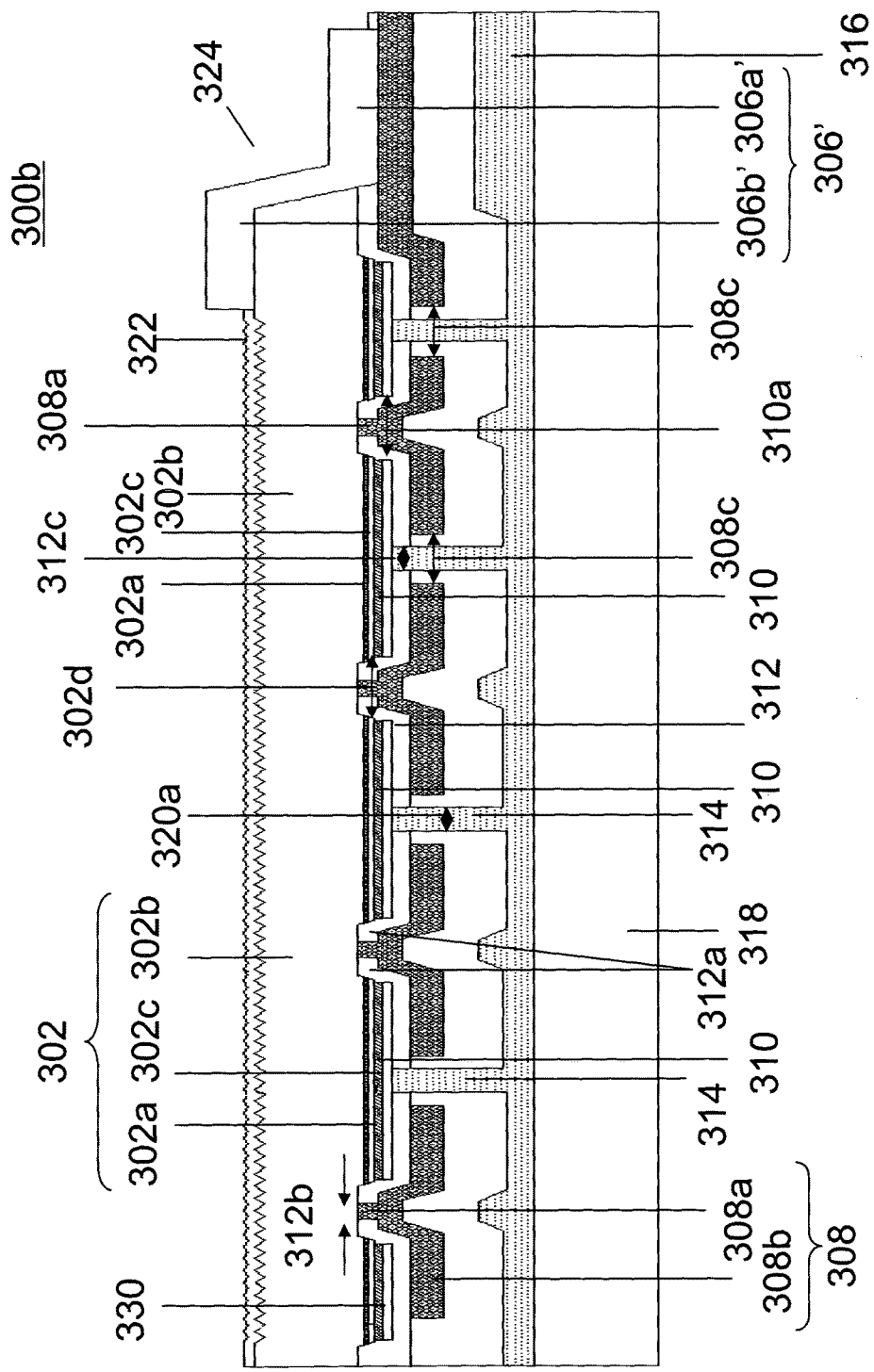
FIG. 3B is another schematic showing a cross-sectional side view of a light emitting device according to various embodiments.

FIG. 3A is a schematic 300a showing a cross-sectional side view of a light emitting device according to various embodiments. FIG. 3B is another schematic 300b showing a cross-sectional side view of a light emitting device according to various embodiments. The light-emitting device may include an active layer 302a. The light-emitting device may include a first semiconductor layer 302b of a first conductivity type. The first semiconductor layer 302b may be in physical contact with the active layer 302a. The light-emitting device may also include a second semiconductor layer 302c of a second conductivity type. The second semiconductor layer 302c may be in physical contact with the active layer 302a and opposite the first conductive layer 302b. The light-emitting device may further include a first electrode 306 in physical contact with a first side of the first semiconductor layer 302b. The light-emitting device may additionally include a second electrode 308 in physical contact with a second side of the first semiconductor layer 302b. The second side of the first semiconductor layer 302b may be different from the first side of the first semiconductor layer 302b. The light-emitting device may also include a third electrode 310 in physical contact with the second semiconductor layer 302c.

The first semiconductor layer 302b of the first conductivity type may be an n-doped layer and the second semiconductor layer 302c of the second conductivity type may be a p-doped layer. The n-doped layer 302b and the p-doped layer 302c may be separated by the active layer 302a, which may also be referred to as a multi-quantum (MQW) layer. An "epitaxial layer stack" may include layers 302a, 302b, 302c.

The stack may be grown on a carrier (not shown), which may include sapphire, silicon, silicon carbide (SiC) or gallium nitride (GaN). Tn epitaxial stack including the active layer 302a, the n-doped layer 302b (first semiconductor layer) and the p-doped layer 302c (second semiconductor layer) may be deposited on the substrate before forming the n-electrode layer 306 (first electrode), the n-contact layer 308 (second electrode) and the p-electrode layer 310 (third electrode).

A method of forming the light emitting device may also be provided. The n-doped layer 302b (first semiconductor layer) may be deposited on the substrate. The active layer 302a may be deposited on the n-doped layer 302b (first semiconductor layer). The p-doped layer 302c (second semiconductor layer) may be deposited on the active layer 302b.

The epiaxial stack may be partly etched to define individual devices. The etching may remove portions of the p-doped layer 302c and the active layer 302a. The etching may expose the n-doped layer 302b. When etching, a suitable material such as photoresist or metal film may be patterned as a mask. Vias holes 302d extending from the active layer 302a to the p-doped layer 302c may be formed by the etching. The n-electrode region 324 may be formed and reserved for subsequent formation of the n-electrode 306 (first electrode). Forming the reserved n-electrode region 324 may include first etching the p-doped layer 302c and the active layer 302a.

The p-electrode 310 (third electrode) may be formed on the p-doped layer 302c. A suitable conductive material may be deposited on the p-doped layer 302c. The suitable conductive material may be patterned to form the p-electrode 310 (third electrode). A barrier layer 330 may be formed on the p-electrode 310 (third electrode). The barrier layer 330 may be electrically conductive. The barrier layer 330 may be configured to protect the p-electrode 310 (third electrode) and may also help in current spreading. The p-electrode 310 (and barrier layer 330) may be etched to form via holes 310a. Via holes 310a may connect via holes 302d to form via holes extending from the active layer 302a to the third electrode 302c. Etching of the via holes 310a and etching of the via holes 302d may be carried out together in a single etching step or may be carried out separately. The epiaxial stack may be partly etched until the n-doped layer 302b is exposed. The p-electrode 310 (third electrode) may be configured to reflect light (i.e. play the role of a light reflector) and may be further configured to conduct current (i.e. play the role of a current conductor). The p-electrode 310 (third electrode) may form an ohmic contact with the p-doped layer 302c.

The p-electrode 310 (third electrode) may include a transparent conducting layer on the p-doped layer 302c. The transparent conducting layer may form an ohmic contact with the p-doped layer 302c. The p-electrode 310 (third electrode) may also include a reflective layer on the transparent conducting layer. The p-electrode 310 (third electrode) may further include a conductive supporting layer on the reflective layer.

The transparent conductive layer may include transparent conductive oxides such as indium-tin-oxide (ITO) or a semi-transparent metal thin film such as palladium (Pd), titanium (Ti), nickel (Ni), chromium (Cr), aluminum (Al) or silver (Ag) etc. The reflective layer may include aluminum (Al), silver (Ag), Al-based alloys or Ag-based alloys. The conductive supporting layer may include platinum (Pt), nickel (Ni), palladium (Pd), silver (Ag), titanium (Ti), aluminum (Al), gold (Au), tungsten (W), chromium (Cr), copper (Cu), indium (In), tin (Sn), titanium nitride (TiN), tungsten titanium nitride (WTiN) or tantalum nitride (TaN) etc.

The method may further include forming a passivation layer 312. The passivation layer 312 may be configured to protect the individual devices. Forming a passivation layer 312 may include depositing a passivation material, and patterning the passivation material. The passivation material may include an insulating inorganic material selected from a group consisting of silicon oxide, silicon nitride, titanium dioxide, aluminum oxide, magnesium oxide, hafnium oxide and tantalum oxide or may include a suitable organic material such as a polymer or a photoresist, e.g. NR-7 or SU-8.

The deposited passivation material may come into contact with the exposed n-doped layer 302b. The deposited passivation material may form one or more passivation structures 312a, each passivation structure 312a within one of the one or more via holes extending from the active layer 302a to the third electrode 310.

The method may include patterning the passivation layer 312. Patterning the passivation layer 312 may form one or more via holes 312b. The one or more via holes may be formed at the passivation structures 312a so that each passivation structure includes one via hole 312b. Patterning the passivation layer 312 may further form one or more further via holes 312c. Each passivation structure 312a may include one further via hole 312c.

In various embodiments, the passivation material may initially completely cover the p-electrode 310 (third electrode). After the passivation layer 312 is patterned, one or more further via holes 312c may be formed. The underlying p-electrode 310 (third electrode) may at least be partially exposed by the one or more further via holes 312c.

In various embodiments, the passivation material 310 deposited may be less and the passivation layer 312 formed may only extend or reach the p-doped layer 302c so that the p-electrode 310 (third electrode) may be exposed.

In both scenarios, the n-doped layer 302b may be exposed by forming via holes 312b. One purpose for the passivation layer 312 may be to isolate the p-doped layer 302c and the exposed n-doped layer 302b for preventing leakage current. The reserved n-electrode region 324 may be also protected from the side of the p-doped layer 302c. The passivation layer may cover the portion of the n-doped layer 302b at the reserved region 324 so that the portion of the n-doped layer 302b at the reserved region 324 may be protected from subsequent patterning, i.e. subsequent etching steps. The passivation layer 312 may include one or more passivation structures 312a and/or one or more via holes 312b and/or one or more further via holes 312c.

The n-contact layer 308 (second electrode) may be formed after forming the passivation layer 312. The passivation layer 312 may be also configured to separate the n-contact layer 308 (second electrode) from the active layer 302a, the p-doped layer 302c (second semiconductor layer) and/or the third electrode 310. In other words, the passivation structure may be formed for (subsequently) separating the second electrode 308 from the active layer 302a, the p-doped layer 302c (second semiconductor layer) and/or the third electrode 310. Current passing through the second electrode 308 may flow to the n-doped layer 302b instead of the active layer 302a, the p-doped layer 302c (second semiconductor layer) and/or the third electrode 310.

The n-contact layer 308 (second electrode) may be formed by depositing a suitable conductive material. The suitable conductive material may be selected from a group consisting of titanium, aluminum, gold, nickel, silver, chromium, tungsten, platinum, titanium nitride and combination thereof. The n-contact layer 308 (second electrode) may be formed by a suitable deposition technique selected from a group consisting of sputtering, evaporation, electroplating and chemical plating. The thickness of the second electrode 308 formed may be about 0.1 µm to about 20 µm. The n-contact layer 308 (second electrode) may include a via portion 308a and a lateral portion 308b. The via portion 308a may be for contacting the n-doped layer 302b. The via portion 308a may be formed on or within the passivation structure 312a of the passivation layer 312, i.e. within via holes 312b. The lateral portion 308b of the n-contact layer 308 (second electrode) may be formed on the lateral portion of the passivation layer 312, the lateral portion, extending from the passivation structures 312a. The n-contact layer 308 (second electrode) in n-electrode region 324 may be (subsequently) employed for leading out the n-electrode layer 306 (first electrode).

The n-contact layer 308 (second electrode) may be patterned with a series of via holes 308c or fingers. The patterning of the n-contact layer 308 (second electrode) may be carried out by etching. The method may further include forming an isolation layer 320 to cover the second electrode 308. A suitable insulating material may be deposited on the n-contact layer 308 (second electrode) to form the isolation layer 320. The suitable insulating material may be selected from an insulative inorganic material such as silicon oxide ($SiO_x$) or silicon nitride ($SiN_x$), $TiO_2$, $Al_2O_3$, MgO, HfO, $Ta_2O_5$ or an organic material such as a polymer, for instance a photoresist such as NR-7 or SU-8. The suitable insulating material may be deposited after patterning of the n-contact layer 308 (second electrode) so that the suitable insulating material fills up the via holes 308c or gaps between the fingers of the patterned n-contact layer 308 (second electrode).

The method may further include patterning the isolation layer 320 to expose at least a portion of the p-electrode layer 310 (third electrode). The isolation layer 320 may be patterned according to the patterned n-contact layer 308 (second electrode). The portions of the isolation layer 320 within the via holes 308c or gaps between the fingers of the patterned n-contact layer 308 (second electrode) may be at least partially removed to form side walls for defining via holes 320a. In various embodiments, the underlying passivation layer 312 may also be patterned for forming one or more further via holes 312c to expose at least a portion of the third electrode 310. Via holes 312c and via holes 320a may form via holes extending from the passivation layer 312 to the isolation layer 320. Via holes 320a may be formed at the same time or may be formed later than via holes 312c. The patterned isolation layer 320 may include side walls defining vias holes 320a. The patterned isolation layer 320 may further include lateral portions covering n-contact layer 308 (second electrode). The lateral portions of the isolation layer 320 may extend from the side walls of the isolation layer 320.

A suitable connection material may then be deposited. The suitable connection material may be a metal or a metallic compound selected from a group consisting of titanium (Ti), copper (Cu), gold (Au), nickel (Ni), silver (Ag), aluminum (Al), tungsten (W), molydenum (Mo), tin (Sn), indium (In), chromium (Cr), tantalum (Ta), titanium nitride (TiN), tantalum nitride (TaN) or combinations thereof. The deposited material may form one or more via interconnect structures 314. Each via interconnect structure may be within one via hole 320a defined by side walls of isolation layer 320 and/or within one via hole 312c of the passivation layer 312). Each via interconnect structure may be within one via hole extending from the passivation layer 312 to the isolation layer 320. The deposited material may also form a connection layer 316 in (electrical) contact with the one or more via interconnect structures. In other words, the method may include depositing a suitable connection material to form one or more via interconnect structures 314 in (electrical) contact with the third electrode 310. The one or more via interconnect structures 314 may be in electrical contact with the third electrode 310 directly or via barrier layer 330. In addition, the method may form a connection layer 316 in (electrical) contact with the via interconnect 314. Each via hole of the one or more via holes 312c of the passivation layer 312 (or each via hole of the one or more via holes 320a of the isolation layer 320) may include a via interconnect 314, the via interconnect 314 in (electrical) contact with the third electrode 310. Each via hole of the one or more via holes extending from the passivation layer 312 to the isolation layer 320 may include a via interconnect 314.

The connection layer 316 may be substantially perpendicular to the one or more interconnect structures 314.

The method may additionally include depositing a suitable metal plating material on the connection layer 316 to form a metal plating 318. The metal plating 318 may be formed by a suitable deposition method such as electroplating or chemical plating. The suitable metal plating material may include copper (Cu), cobalt (Co), tungsten (W), molybdenum (Mo), nickel (Ni) or metal alloys thereof.

The method may further include removing the substrate to form an intermediate structure. The substrate may be removed using a chemical method or a mechanical method.

The method may also include patterning the first semiconductor layer 302b. The intermediate structure is re-oriented by substantially by 180° before patterning the n-doped layer 302b (first semiconductor layer). In other words, the intermediate structure may be flipped upside down before patterning the first semiconductor layer 302b. Patterning the n-doped layer 302b (first semiconductor layer) may include or may refer to performing surface texturing. The surface texturing process may be carried out using etching, i.e. wet etching or dry etching. The pattern formed may be periodic or random.

The method may further include forming a protection layer 322 on n-doped layer 302b (first semiconductor layer) after patterning the n-doped layer 302b (first semiconductor layer). The protection layer 322 may be formed by depositing a suitable protective material on the n-doped layer 302b (first semiconductor layer). The protective material may be an insulative inorganic material such as silicon oxide ($SiO_x$) or silicon nitride ($SiN_x$), $TiO_2$, $Al_2O_3$, MgO, HfO, $Ta_2O_5$ or an organic material such as a polymer, for instance a photoresist such as NR-7 or SU-8.

The method may additionally include etching a portion of the n-doped layer 302b (first semiconductor layer), i.e. at the reserved n-electrode region 324, to expose at least a portion of the n-contact layer 308 (second electrode). The portion of the n-contact layer 308 (as well as the underlying portions of isolation layer 320, connection layer 316 and metal plating 318) may be previously formed on the reserved n-electrode region 324 of the n-doped layer 302b. The n-electrode layer 306 may then be formed on the portion of the n-contact layer 308. In other words, the method may include opening the n-doped layer 302b (first semiconductor layer) from the bottom using etching to expose at least a portion of the n-contact layer 308 (second electrode). The n-electrode layer 306 (first electrode) may be formed in contact with the n-contact layer 308 (second electrode) and/or n-doped layer 302b (first semiconductor layer). The n-electrode layer 306 may include an adhesion layer and a contact layer. The adhesion layer may be in contact with the n-contact layer 308 (second electrode) and/or n-doped layer 302b (first semiconductor layer). The contact layer may be formed from a contact material selected from titanium (Ti), nickel (Ni), platinum (Pt), silver (Ag), aluminum (Al), gold (Au), chromium (Cr), tungsten (W), palladium (Pd), titanium nitride (TiN) or the like. The n-electrode layer 306 (first electrode) may have a thickness of about 0 μm to about 20 μm. The n-electrode layer 306 (first electrode) may be formed by a suitable deposition method such as sputtering, evaporation, electroplating or chemical plating. The n-electrode layer 306 (first electrode) may include a metal pad 306a and/or metallization 306b in contact with the metal pad 306a.

The n-electrode layer 306 (first electrode) may be patterned to form a patterned n-electrode layer 306' as shown in FIG. 3B. The patterned n-electrode layer 306' may also include a metal pad 306a' and/or metallization 306b' in contact with the metal pad 306a'. The n-electrode layer 306 (first electrode) may be patterned after the process of surface texturing process.

The current guiding design at the top may be based according to the current guiding design at the bottom. In other words, the layout of the patterned n-electrode layer 306' (first electrode) may be based on the layout of the n-contact layer 308 (second electrode). The patterned n-electrode layer 306' may be in contact with the n-contact layer 308 (second electrode) and/or n-doped layer 302b (first semiconductor layer).

The n-electrode layer 306, 306' (first electrode) and the n-contact layer 308 (second electrode) may work as a double-sided guiding structure for improving current spreading.

Figure 3D:
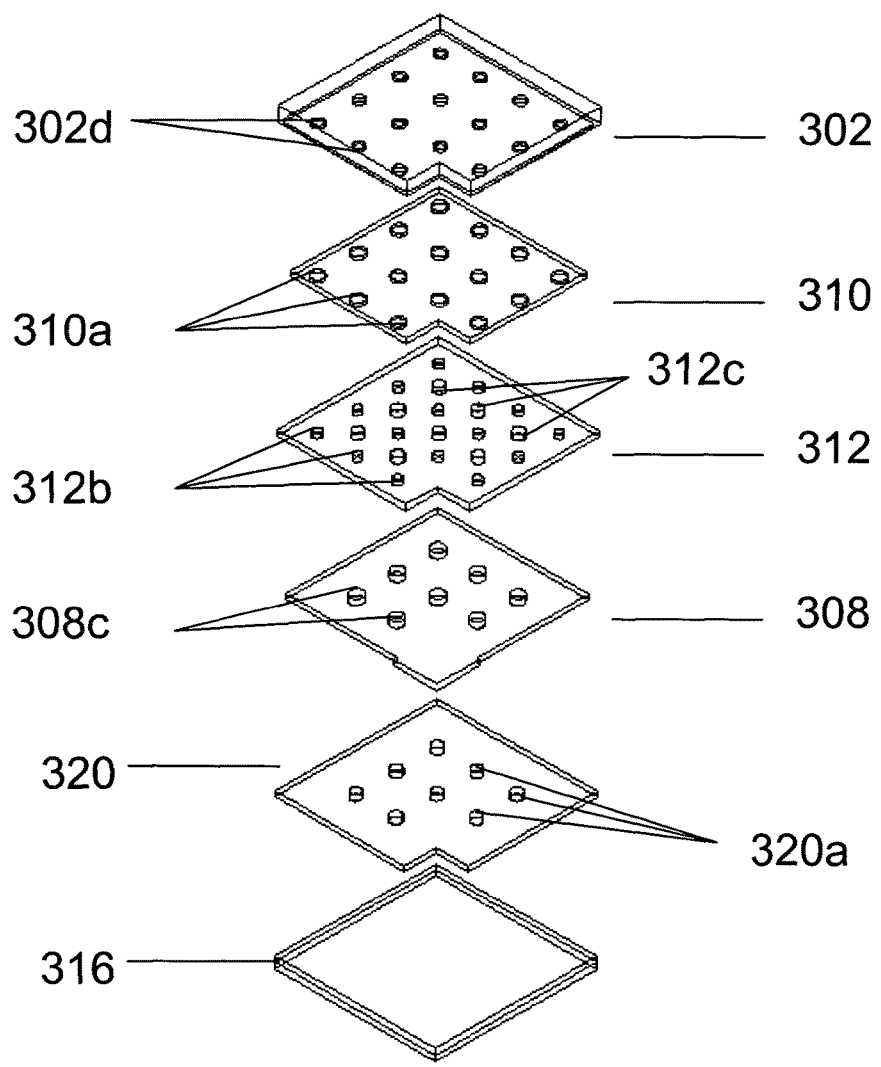
FIG. 3D is a schematic showing an expanded perspective view of the different layers of the light-emitting device according to various embodiments.

FIG. 3C is a schematic 300c showing a cross-sectional planar view of the light-emitting device according to various embodiments. FIG. 3D is a schematic 300d showing an expanded perspective view of the different layers of the light-emitting device according to various embodiments.

FIGS. 3C and D illustrate a method forming contacts using via holes, which may improve current spreading and efficiency. When the epitaxial stack is partially etched, the reserved n-electrode region 324 may be exposed and via holes 302d may be formed. The p-electrode layer 310 may be deposited and etched to form via holes 310a having individual diameters greater than the individual diameters of the via holes 302d. After the passivation layer 312 is patterned, via holes 312b may be formed inside via holes 302d, i.e. the individual diameters of via holes 312b are smaller than the individual diameters of via holes 302d. The n-contact layer 308 (second electrode) may be deposited and patterned to form via holes 308c. Via portions 308a may also be formed within via holes 312b. The isolation layer 320 may then be deposited and via holes 320a may be formed inside via holes 308c. Via holes 320a may carry via interconnect structures 314, which connect the connection layer 316 with p-electrode layer 310. The passivation layer 312 may further include further via holes 312c. The via holes 320a may be substantially flush or in line with the via holes 312c.

Figure 4:
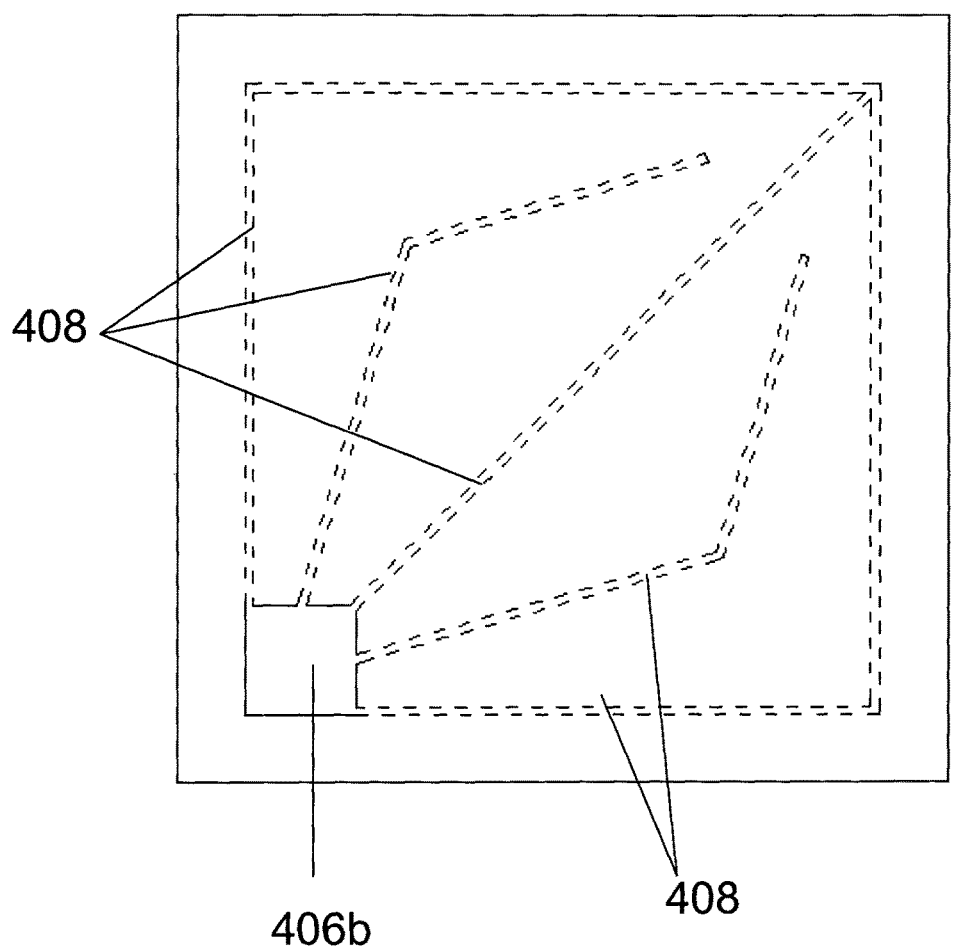
FIG. 4 is a schematic showing a planar view of electrode design according to various embodiments.

FIG. 4 is a schematic 400 showing a planar view of electrode design according to various embodiments. The dotted lines indicate the second electrode while the solid lines indicate the first electrode. The first electrode may include only a metal pad 406b. The second electrode 408 may include a plurality of cross fingers. The first electrode may be in contact with the second electrode.

Figure 5:
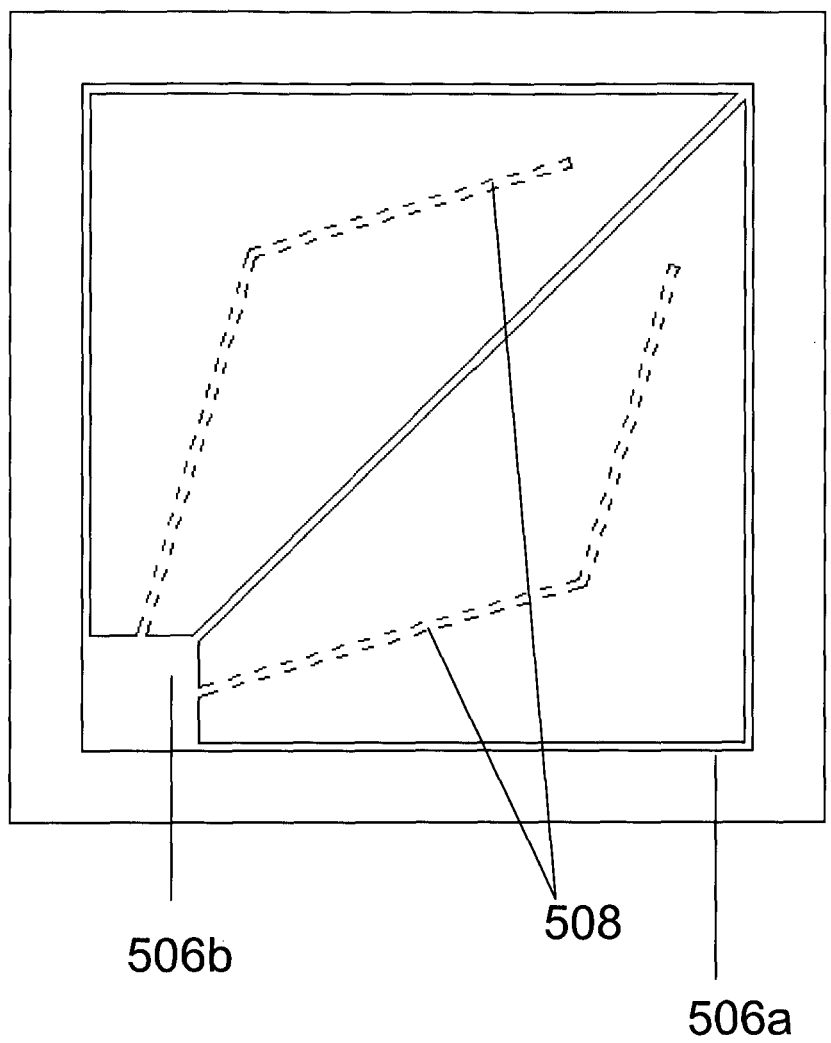
FIG. 5 is a schematic showing a planar view of another electrode design according to various embodiments.

FIG. 5 is a schematic 500 showing a planar view of another electrode design according to various embodiments. Similarly, the dotted lines indicate the second electrode while the solid lines indicate the first electrode. The first electrode may be patterned. The first electrode may include a metal pad 506b and metallization 506a in contact with the metal pad 506b. The second electrode 508 may include a plurality of cross fingers. The first electrode may be in contact with the second electrode.

Figure 6:
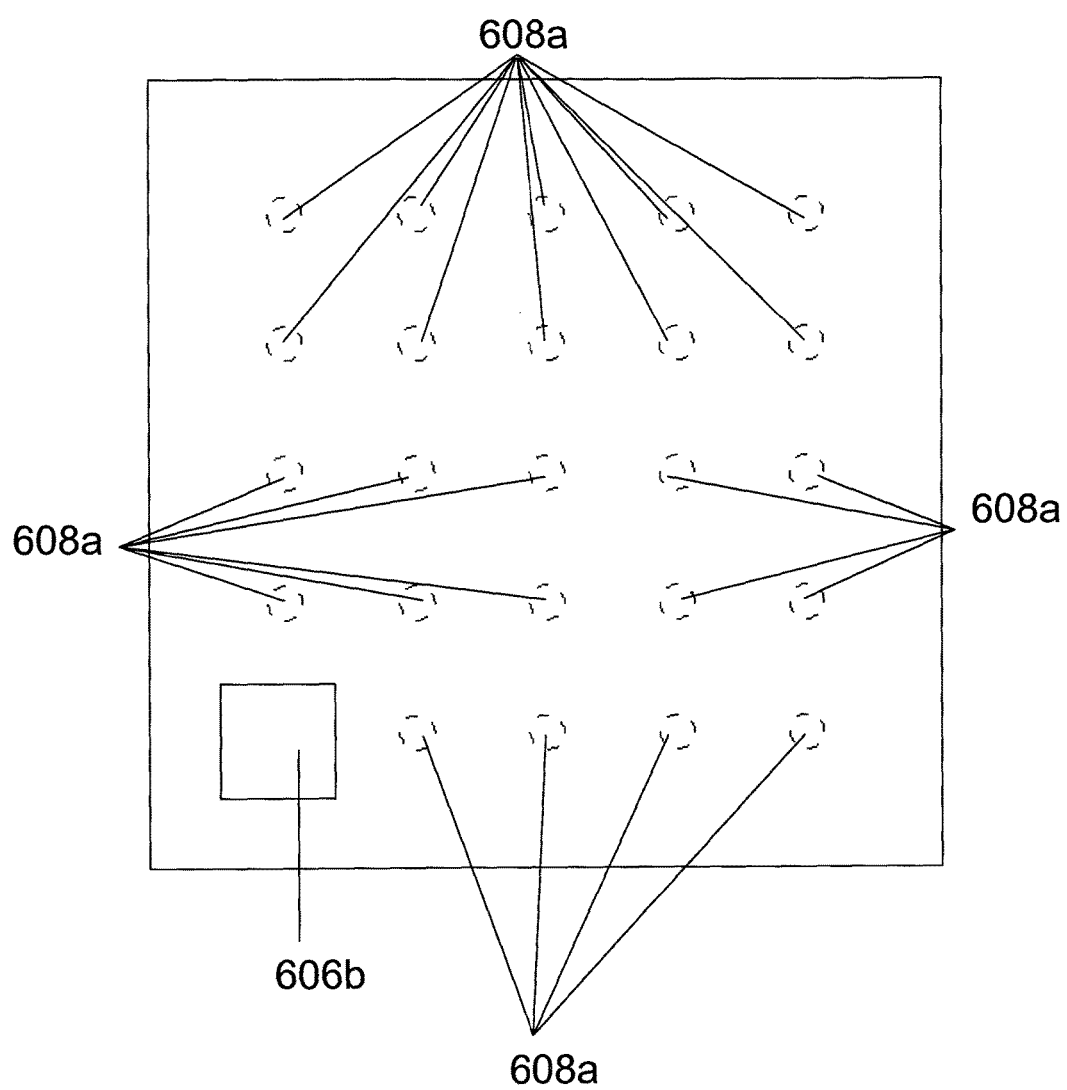
FIG. 6 is a schematic showing a planar view of a further electrode design according to various embodiments.

FIG. 6 is a schematic 600 showing a planar view of a further electrode design according to various embodiments. Similarly, the dotted lines indicate the second electrode while the solid lines indicate the first electrode. The first electrode may include only a metal pad 606b. The second electrode 608 may include a plurality of via portions 608a. The via portions 608a may be interconnected. The first electrode may be in contact with the second electrode.

Figure 7:
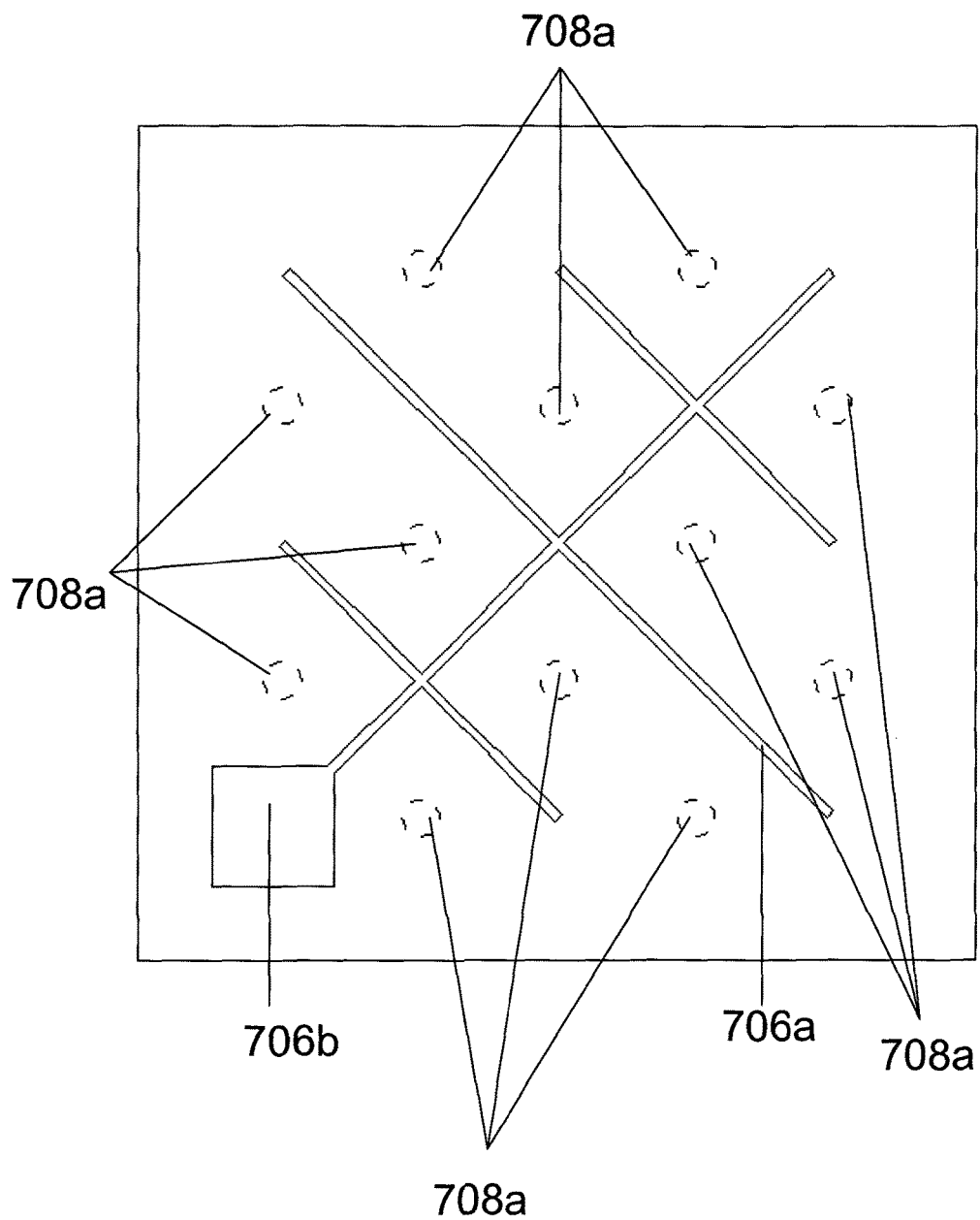
FIG. 7 is a schematic showing a planar view of yet another electrode design according to various embodiments.

FIG. 7 is a schematic 700 showing a planar view of yet another electrode design according to various embodiments. The dotted lines indicate the second electrode while the solid lines indicate the first electrode. The first electrode may be patterned. The first electrode may include a metal pad 706b and metallization such as cross-fingers 706a in contact with the metal pad 706b. The cross-fingers may extend from the metal pad 706b. The second electrode 708 may include a plurality of via portions 708a. The via portions 708a may be interconnected. The first electrode may be in contact with the second electrode.

Figure 8A:
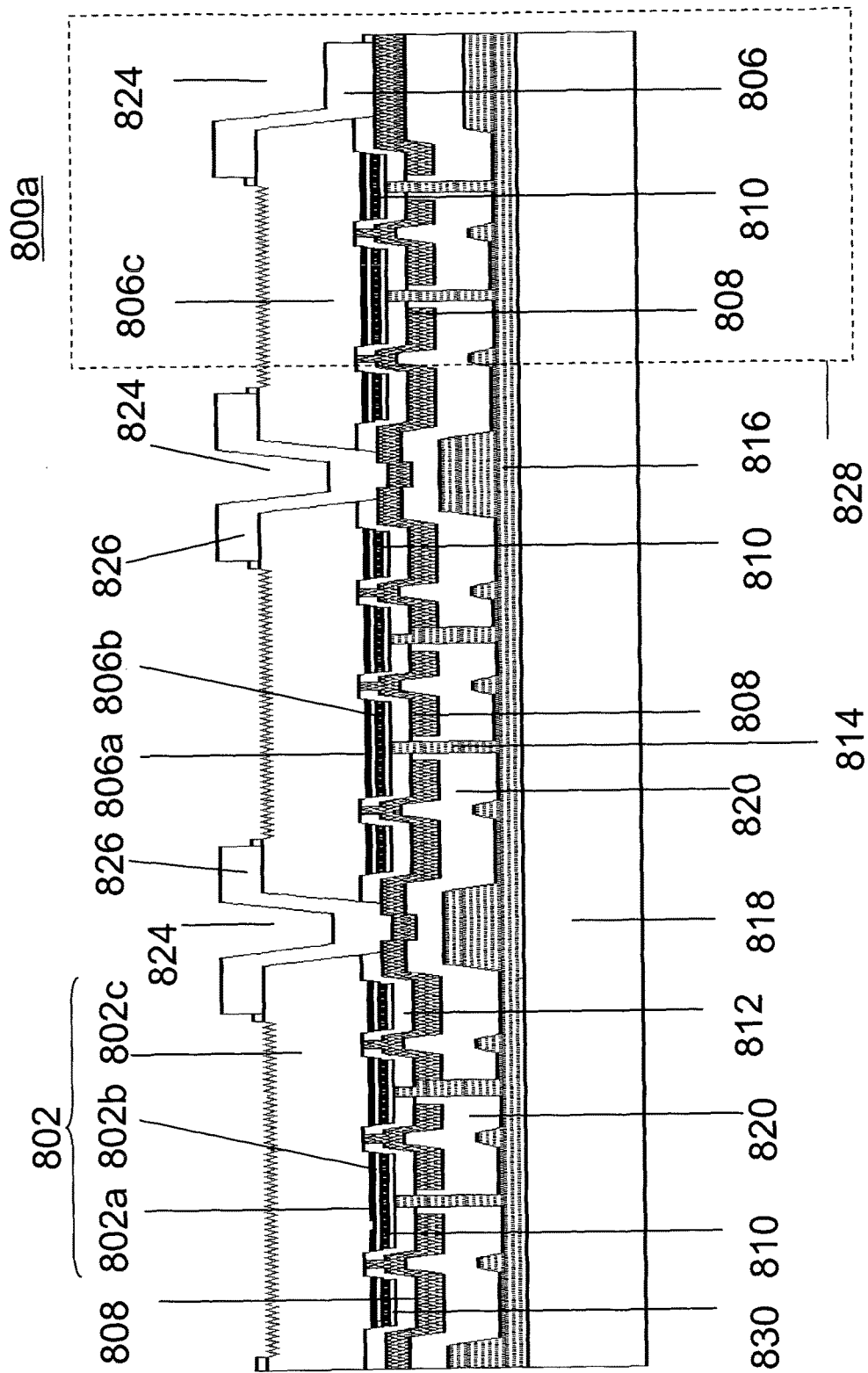
FIG. 8A is a schematic showing a side view of a light emitting array according to various embodiments.
Figure 8B:
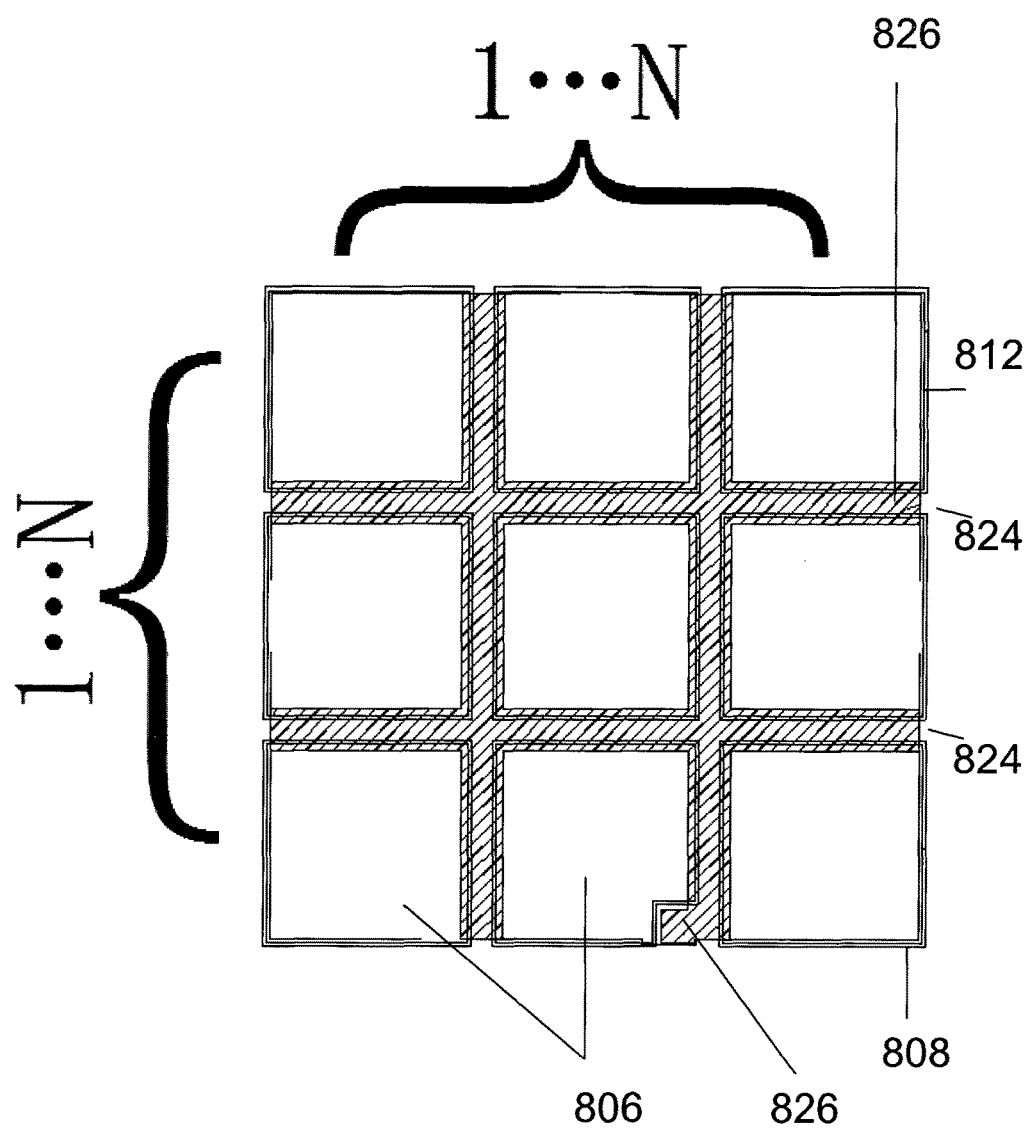
FIG. 8B is a schematic showing a top planar view of the light emitting array according to various embodiments.

FIG. 8A is a schematic 800a showing a side view of a light emitting array according to various embodiments. FIG. 8B is a schematic 800b showing a top planar view of the light emitting array according to various embodiments. The light-emitting array may include a plurality of light-emitting devices 828 as described herein The light-emitting device may be the light-emitting devices as illustrated in FIG. 3A or 3B.

Each light-emitting device 828 may include an active layer 802a. Each light-emitting device 828 may include a first semiconductor layer 802b of a first conductivity type.

The first semiconductor layer 802b may be in physical contact with the active layer 802a. Each light-emitting device 828 may also include a second semiconductor layer 802c of a second conductivity type. The second semiconductor layer 802c may be in physical contact with the active layer 802a and opposite the first conductive layer 802b. Each light-emitting device 828 may further include a first electrode 806 in physical contact with a first side of the first semiconductor layer 802b. Each light-emitting device 828 may additionally include a second electrode 808 in physical contact with a second side of the first semiconductor layer 802b. The second side of the first semiconductor layer 802b may be different from the first side of the first semiconductor layer 802b. Each light-emitting device 828 may also include a third electrode 810 in physical contact with the second semiconductor layer 802c.

Each light-emitting device 828 may also include a passivation layer 812 separating the second electrode 808 from the active layer 802a, the second semiconductor layer 802c and the third electrode 810.

The passivation layer 812 may include one or more via holes. Each of the one or more via holes of the passivation layer 812 may include or carry a via interconnect 814. The via interconnect 814 may be in electrical contact with the third electrode 810 directly or via electrically conductive barrier layer 830.

Each light-emitting device 828 may further include a connection layer 816 in (electrical) contact with the via interconnect 814. Each light-emitting device 828 may also include a metal plating 818 in (electrical) contact with the connection layer 816.

Each light-emitting device 828 may further include an isolation layer 820 for separating the second electrode 808 from the via interconnect 814.

Each light-emitting device 828 may include a reserved region 824 for forming the first electrode 806.

The light-emitting array may include one or more interconnecting layers 826.

Each of the one or more interconnecting layers 826 may be in contact with a first light-emitting device and a second light-emitting device of the plurality of light-emitting devices. The first light-emitting device may be neighboring to the second light-emitting device.

A method of forming a light-emitting array may also be provided. The method may include forming a plurality of light-emitting devices according to any method described herein. The method may include forming one or more interconnecting layers 826 so that each of the one or more interconnecting layers is in contact with a first light-emitting device and a second light-emitting device of the plurality of light-emitting devices.

In other words, the method including forming one or more interconnecting layers 826 so that neighbouring light-emitting devices may be connected via one interconnecting layer.

For high power applications, an array of light-emitting devices may be typically designed and integrated for both horizontal and vertical diodes. After the first semiconductor layer 802c is opened at reserved region 824 by etching, the second electrode 808 may be exposed. An interconnecting layer 826 may be formed or patterned on the second electrode 808. A common first electrode 806 may be formed on the second electrode 808 of one light-emitting device of a row of light-emitting devices and one interconnecting layer 826 may be formed on the second electrode 808 of each of the remaining light-emitting devices of the row of light-emitting devices.

Suitable materials for forming the interconnecting layer 826 may include titanium (Ti), nickel (Ni), platinum (Pt), silver (Ag), aluminum (Al), gold (Au), chromium (Cr), tungsten (W), palladium (Pd), titanium nitride (TiN) or the like. The thickness of the interconnecting layer 826 may be from about 0 to about 20 μm.

As shown in FIG. 8B, the array may include 1-N devices by 1-N devices. N may range from 1 to 100.

FIG. 9 is a schematic 900 illustrating a method of forming a light-emitting device according to various embodiments.

The method may include, in 902, forming an active layer. The method may also include, in 904, forming a first semiconductor layer of a first conductivity type so that the first semiconductor layer is in physical contact with the active layer. The method may also include, in 906, forming a second semiconductor layer of a second conductivity type so that the second semiconductor layer is in physical contact with the active layer and opposite the first conductive layer. The method may further include, in 908, forming a first electrode in physical contact with a first side of the first semiconductor layer. The method may additionally include, in 910, forming a second electrode in physical contact with a second side of the first semiconductor layer, the second side of the first semiconductor layer different from the first side of the first semiconductor layer. The method may also include, in 912, forming a third electrode so that the third electrode is in physical contact with the second semiconductor layer, thereby forming the light-emitting device.

In other words, a method of forming a light-emitting device may be provided. The device may include an active layer between a first semiconductor layer and a second semiconductor layer. The method may also provide forming a first electrode so that the first electrode may be in physical contact with one side of the first semiconductor layer and forming a second electrode so that the second electrode may be in physical contact with another separate side of the first semiconductor layer. The method may additionally include forming a third electrode so that the third electrode may be in physical contact with the second semiconductor layer. The first semiconductor layer may be doped differently from the second semiconductor layer.

An epitaxial stack including the active layer, the first semiconductor layer and the second semiconductor layer may be deposited on a substrate before forming the first electrode, the second electrode and the third electrode.

The first semiconductor layer may be deposited on the substrate. Subsequently, the active layer may be deposited on the first semiconductor layer. The second semiconductor layer may then be deposited on the active layer.

Forming the third electrode may include depositing a suitable conductive material on the second semiconductor layer. The suitable conductive material may then be patterned to form the third electrode. The suitable conductive material selected from a group consisting of titanium, aluminum, gold, nickel, silver, chromium, tungsten, platinum, titanium nitride and combination thereof.

The method may further include forming a passivation layer for separating the second electrode from the active layer, the second semiconductor layer and/or the third electrode. In other words, the passivation layer may be configured to separate the second electrode from one or more of the active layer, the second semiconductor layer and the third electrode.

Forming the passivation layer may include depositing a passivation material. Forming the passivation layer may further include patterning the passivation material. The second electrode may be formed after forming the passivation layer.

The second electrode may be formed by depositing a suitable conductive material selected from a group consisting of titanium, aluminum, gold, nickel, silver, chromium, tungsten, platinum, titanium nitride and combination thereof.

The second electrode may be formed by a suitable deposition technique selected from a group consisting of sputtering, evaporation, electroplating and chemical plating.

The method may include forming an isolation layer to cover the second electrode. The method may also include patterning the isolation layer to expose at least a portion of the third electrode. The isolation layer may separate the second electrode from the third electrode.

The method may also include depositing a suitable connection material to form a via interconnect structure in (electrical) contact with the third electrode. The method may also include depositing the suitable connection material to form a connection layer in (electrical) contact with the via interconnect. In other words, the via interconnect structure and the connection layer may be formed by depositing the suitable connection material.

In various embodiments, the via interconnect structure and the connection layer may include different materials. The method may include depositing a first suitable connection material to form a via interconnect structure in (electrical) contact with the third electrode. The method may further include depositing a second suitable connection material to form a connection layer in (electrical) contact with the via interconnect structure.

The isolation layer may be configured to separate the second electrode from the via interconnect structure.

The method may also include depositing a suitable metal plating material on the connection layer to form a metal plating.

The method may include removing the substrate to form an intermediate structure. The method may include patterning the first semiconductor layer. The intermediate structure may be re-oriented by substantially by 180° before patterning the first semiconductor layer. In other words, the intermediate structure may be turned upside-down prior to patterning the first semiconductor layer. Patterning the first semiconductor layer may include etching the first semiconductor layer via a surface texturing process. The surface texturing process may be carried out on a surface side of the first semiconductor layer, i.e. the side facing away from the active layer.

The method may additionally include forming a protection layer on the first semiconductor layer after patterning the first semiconductor layer. The protection layer may be formed on the surface side of the first semiconductor layer.

The method may further include etching a portion of the first semiconductor layer to expose at least a portion of the second electrode. The first electrode may be formed on the exposed portion of the second electrode.

A method of forming a light-emitting array may also be provided. The method may include forming a plurality of light-emitting devices according to any method described herein. The method may include forming one or more interconnecting layers so that each of the one or more interconnecting layers is in contact with a first light-emitting device and a second light-emitting device of the plurality of light-emitting devices.

In conventional designs of vertical structured diodes, the n-electrode patterned on top of the device by photolithography may block the light generated from the active region. Moreover, the current spreading may be also restricted by the conductivity of the n-electrode layout, which may lead to efficiency drop especially in the high current density regime.

Compared with these prior arts, various embodiments may provide new structures with double-sided current guiding designs for vertical structured diodes. Various embodiments may include a current guiding design at the bottom of the device, which may improve the light extraction efficiency. The contact method through a series of via structures may contribute to the optimization for current spreading. The n-electrode may be led out upside and may be patterned according to the current guiding design on the bottom, which may improve the uniformity of current spreading and contribute to the reduction of efficiency drop in the devices.

Further, an array of diodes with interconnecting structures at the top and via hole connection at the bottom may be formed. The interconnecting structures and via hole connection may be parallel connections.

In addition to the N-face protection, a passivation layer may also be formed to protect the MQWs from the side of the p-doped layer, which may also be used as the etching ending layer for the n-electrode region opening. The double side protection structure may reduce the current leakage and thus improve the reliability of the diodes.

In other words, new structures with the double-sided current guiding designs for vertical structured diodes may be provided. The current guiding designs may be patterned at the bottom and the electrode led out upside, and the electrode led out may be patterned according to the current guiding design on the bottom. One example for the contact method may include forming a series of via holes. Various embodiments also provide an array of diodes with the double-sided current guiding structures.

Advantages of various embodiments may include one or more of the following:

Better electrical properties like lower forward voltage and less efficiency droop may be achieved. As the n-electrode may be led out upside and may be patterned according to the current guiding design on the bottom, the uniformity of current spreading may be improved and better electrical properties may be achieved in the device. Forming a series of via hole structures as the contact method may be effective for the reduction of forward voltage and the improvement of the efficiency drop.

The efficiency of light extraction may be improved. The layout of the n-electrode on the top surface may be designed according to the current guiding design on the bottom, which may provide more flexibility compared to the conventional diodes with only one n-electrode. For the array of diodes, the integrated process may be helpful for the improvement of light intensity and efficiency of light extraction.

The current leakage may be reduced and the reliability for the diode may be improved. In addition to the N-face protection, passivation may also formed to protect the MQWs from the side of the p-doped layer, which may also used as the etching ending layer for the n-electrode region opening.

A simplified and reliable process may be provided for the diode packaging. Generally, the process of bumping and bonding cannot be avoided for the packaging of some diodes. The circuit board with pattern for bonding may be designed specially to match the chip structure, which may increase the complexity of the fabrication and reduce the yield for process integration. In various embodiments, the p-electrode and the n-electrode may be fabricated separately on the top and the bottom of the device. Therefore, various embodiments provide a structure which is simple, efficient, reliable and compatible to mass production.

Methods described herein may further contain analogous features of any structure, device or array described herein. Correspondingly, structures, devices or arrays described herein may further contain analogous features of any method described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A light-emitting device comprising:
an active layer;
a first semiconductor layer of a first conductivity type, the first semiconductor layer in physical contact with the active layer;
a second semiconductor layer of a second conductivity type, the second semiconductor layer in physical contact with the active layer and opposite the first semiconductor layer;
a first electrode in physical contact with a first lateral side of the first semiconductor layer;
a second electrode in physical contact with a second lateral side of the first semiconductor layer, the second lateral side of the first semiconductor layer being different from the first lateral side of the first semiconductor layer; and
a third electrode in physical contact with the second semiconductor layer, wherein the first electrode and the second electrode are physically isolated from a surface side of the first semiconductor layer joining the first lateral side and the second lateral side, the surface side being configured to transmit light generated by the light-emitting device.

2. The light-emitting device according to claim 1, wherein the first electrode is in physical contact with the second.

3. The light-emitting device according to claim 1, wherein the second lateral side of the first semiconductor layer is opposite the first lateral side of the first semiconductor layer.

4. The light-emitting device according to any of claim 1, further comprising:
a passivation layer separating the second electrode from the active layer, the second semiconductor layer and the third electrode.

5. The light-emitting device according to claim 4, wherein the passivation layer comprises one or more passivation structures.

6. The light-emitting device according to claim 4, wherein the passivation layer comprises an insulating inorganic material selected from a group consisting of silicon oxide, silicon nitride, titanium dioxide, aluminum oxide, magnesium oxide, hafnium oxide and tantalum oxide.

7. The light-emitting device according to claim 4, wherein the passivation layer comprises a suitable organic material.

8. The light-emitting device according to claim 4, wherein the passivation layer comprises one or more via holes.

9. The light-emitting device according to claim 8, wherein each of the one or more via holes of the passivation layer comprises a via interconnect electrically connected to the third electrode.

10. The light-emitting device according to claim 9 further comprising:
a connection layer in contact with the via interconnect.

11. The light-emitting device according to claim 9, further comprising:
an isolation layer for separating the second electrode from the via interconnect.

12. The light-emitting device according to claim 1, wherein a portion of the first semiconductor layer directly over the active region is configured to transmit light.

13. The light-emitting device according to claim 12, wherein the portion of the first semiconductor layer directly over the active region is unblocked by the first electrode.

14. The light-emitting device according to claim 12, wherein the portion of the first semiconductor layer directly over the active region is patterned.

15. The light-emitting device according to claim 12, further comprising:
a protection layer in contact with the portion of the first semiconductor layer directly over the active region.

16. The light-emitting device according to claim 1, wherein the third electrode comprises:
a transparent conducting layer in contact with the second semiconductor layer;
a reflective layer in contact with the transparent conducting layer; and
a conductive supporting layer in contact with the reflective layer.

17. A light-emitting array comprising:
a plurality of light-emitting devices, each light-emitting device comprising:
an active layer;
a first semiconductor layer of a first conductivity type, the first semiconductor layer in physical contact with the active layer;
a second semiconductor layer of a second conductivity type, the second semiconductor layer in physical contact with the active layer and opposite the first semiconductor layer;
a first electrode in physical contact with a first lateral side of the first semiconductor layer;
a second electrode in physical contact with a second lateral side of the first semiconductor layer, the second lateral side of the first semiconductor layer being different from the first lateral side of the first semiconductor layer; and
a third electrode in physical contact with the second semiconductor layer; and
one or more interconnecting layers, wherein:
the first electrode and the second electrode are physically isolated from a surface side of the first semiconductor layer joining the first lateral side and the second lateral side, the surface side being configured to transmit light generated by the light-emitting device; and
each of the one or more interconnecting layers is in contact with a first light-emitting device and a second light-emitting device of the plurality of light-emitting devices.

18. A method of forming a light-emitting device, the method comprising:
forming an active layer;
forming a first semiconductor layer of a first conductivity type so that the first semiconductor layer is in physical contact with the active layer;
forming a second semiconductor layer of a second conductivity type so that the second semiconductor layer is in physical contact with the active layer and opposite the first semiconductor layer;
forming a first electrode in physical contact with a first lateral side of the first semiconductor layer;
forming a second electrode in physical contact with a second lateral side of the first semiconductor layer, the second lateral side of the first semiconductor layer being different from the first lateral side of the first semiconductor layer; and
forming a third electrode so that the third electrode is in physical contact with the second semiconductor layer, thereby forming the light-emitting device, wherein the first electrode and the second electrode are physically isolated from a surface side of the first semiconductor layer joining the first lateral side and the second lateral side, the surface side being configured to transmit light generated by the light-emitting device.

19. A method of forming a light-emitting array, the method comprising:
forming a plurality of light-emitting devices, wherein the forming of each light-emitting device comprises:
forming an active layer;
forming a first semiconductor layer of a first conductivity type so that the first semiconductor layer is in physical contact with the active layer;
forming a second semiconductor layer of a second conductivity type so that the second semiconductor layer is in physical contact with the active layer and opposite the first semiconductor layer;
forming a first electrode in physical contact with a first lateral side of the first semiconductor layer;
forming a second electrode in physical contact with a lateral second side of the first semiconductor layer, the second lateral side of the first semiconductor layer being different from the first lateral side of the first semiconductor layer; and
forming a third electrode so that the third electrode is in physical contact with the second semiconductor layer, thereby forming the light-emitting device; and
forming one or more interconnecting layers so that each of the one or more interconnecting layers is in contact with a first light-emitting device and a second light-emitting device of the plurality of light-emitting devices, wherein the first electrode and the second electrode are physically isolated from a surface side of the first semiconductor layer joining the first lateral side and the second lateral side, the surface side being configured to transmit light generated by the light-emitting device.

* * * * *